(12) United States Patent
Ye et al.

(10) Patent No.: US 6,534,416 B1
(45) Date of Patent: Mar. 18, 2003

(54) CONTROL OF PATTERNED ETCHING IN SEMICONDUCTOR FEATURES

(75) Inventors: Yan Ye, Campbell, CA (US); Allen Zhao, Mountain View, CA (US); Xiancan Deng, Santa Clara, CA (US); Diana Xiaobing Ma, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/637,509

(22) Filed: Aug. 11, 2000

Related U.S. Application Data

(62) Division of application No. 09/393,446, filed on Aug. 9, 1999, which is a continuation of application No. 08/911,878, filed on Aug. 13, 1997, now Pat. No. 6,008,140.

(51) Int. Cl.$^7$ ............................................. H01L 21/302
(52) U.S. Cl. ..................... 438/714; 438/720; 216/67; 216/78
(58) Field of Search ................................ 438/720, 714; 216/78, 67

(56) References Cited

U.S. PATENT DOCUMENTS

| | | | |
|---|---|---|---|
| 4,256,534 A | 3/1981 | Levinstein et al. | 156/643 |
| 4,351,696 A | 9/1982 | Radigan | 156/643 |
| 4,557,796 A | 12/1985 | Druschke et al. | 156/643 |
| 4,668,335 A | 5/1987 | Mockler et al. | 156/643 |

(List continued on next page.)

FOREIGN PATENT DOCUMENTS

| | | |
|---|---|---|
| JP | 1-234578 | 9/1989 |
| JP | 2-295117 | 12/1990 |

(List continued on next page.)

OTHER PUBLICATIONS

"In Situ Fiber Optic Thermometry of Wafer Surface Etched with an Electron Cyclotron Resonance Source"; J. Vac Sci. Tech. B, vol. 14; No. 3; abstract only; Thomson et. al.*

(List continued on next page.)

*Primary Examiner*—George Goudreau
(74) *Attorney, Agent, or Firm*—Shirley L. Church; Kathi Bean

(57) ABSTRACT

Copper can be pattern etched in a manner which provides the desired feature dimension and integrity, at acceptable rates, and with selectivity over adjacent materials. To provide for feature integrity, the portion of the copper feature surface which has been etched to the desired dimensions and shape must be protected during the etching of adjacent feature surfaces. To avoid the trapping of reactive species interior of the etched copper surface, hydrogen is applied to that surface. Hydrogen is adsorbed on the copper exterior surface and may be absorbed into the exterior surface of the copper, so that it is available to react with species which would otherwise penetrate that exterior surface and react with the copper interior to that surface. Sufficient hydrogen must be applied to the exterior surface of the etched portion of the copper feature to prevent incident reactive species present due to etching of adjacent feature surfaces from penetrating the previously etched feature exterior surface. The most preferred embodiment of the invention provides for the use of hydrogen chloride (HCl) and/or hydrogen bromide (HBr) as the sole or principal source of the reactive species used in etching copper. Dissociation of the HCl and/or HBr provides the large amounts of hydrogen necessary to protect the copper feature etched surfaces from penetration by reactive species adjacent the etched surface. Additional hydrogen gas may be added to the plasma feed gas which comprises the HCl and/or HBr when the reactive species density in the etch process chamber is particularly high. Although the HCl or HBr may be used as an additive in combination with other plasma feed gases, preferably HCl or HBr or a combination thereof accounts for at least 40%, and more preferably at least 50%, of the reactive species generated by the plasma. Most preferably, HCl or HBr should account for at least 80% of the reactive species generated by the plasma.

7 Claims, 6 Drawing Sheets

U.S. PATENT DOCUMENTS

| | | | |
|---|---|---|---|
| 5,126,008 A | 6/1992 | Levy | 156/665 |
| 5,186,718 A | 2/1993 | Tepman et al. | 29/25.01 |
| 5,200,031 A | 4/1993 | Latchford et al. | 156/659.1 |
| 5,240,559 A | 8/1993 | Ishida | 456/666 |
| 5,244,535 A | 9/1993 | Ohtsuka et al. | 156/643 |
| 5,269,878 A | 12/1993 | Page et al. | 156/640 |
| 5,302,241 A | 4/1994 | Cathey, Jr. | 156/664 |
| 5,336,363 A | 8/1994 | Morita | 156/625 |
| 5,348,619 A | 9/1994 | Bohannon et al. | 156/664 |
| 5,376,235 A | 12/1994 | Langley | 156/664 |
| 5,387,315 A | 2/1995 | Sandhu | 156/646 |
| 5,387,556 A | 2/1995 | Xiaobing et al. | 437/228 |
| 5,389,194 A | 2/1995 | Rostoker et al. | 156/636 |
| 5,411,631 A | 5/1995 | Hori et al. | 216/72 |
| 5,462,892 A | 10/1995 | Gabriel | 437/189 |
| 5,544,191 A | 8/1996 | Ohzu et al. | 372/56 |
| 5,567,267 A * | 10/1996 | Kazama et al. | 156/345 |
| 5,578,166 A | 11/1996 | Hirota | 156/643.1 |
| 5,660,740 A * | 8/1997 | Komino | 216/67 |
| 5,711,851 A * | 1/1998 | Blalock et al. | 156/643.1 |
| 5,968,847 A * | 10/1999 | Ye et al. | 438/734 |
| 6,008,140 A * | 12/1999 | Ye et al. | 438/742 |
| 6,010,603 A * | 1/2000 | Ye et al. | 438/742 |
| 6,046,116 A | 4/2000 | DeOrnellas et al. | 438/715 |
| 6,077,384 A * | 6/2000 | Collins et al. | 156/345 |

FOREIGN PATENT DOCUMENTS

| | | | |
|---|---|---|---|
| JP | 4-099290 | | 3/1992 |
| JP | 4-173988 | | 6/1992 |
| JP | 4-187787 | | 7/1992 |
| JP | 4-199821 | | 7/1992 |
| JP | 4-199824 | | 7/1992 |
| JP | 4-350939 | | 12/1992 |
| JP | 5-275388 | | 10/1993 |
| JP | 7-161687 | | 6/1995 |
| JP | 7-201856 | | 8/1995 |
| JP | 02-007520 | * | 1/2000 |

OTHER PUBLICATIONS

A. Aliouchouche et al., "Laser chemical ethcing of copper films", *SPIE*, vol. 2403, pp. 425–434 (1995).

A. Bertz et al., "Effects of the biasing frequency on RIE of Cu in a $Cl_2$–based discharge", *Applied Surface Science*, 91, pp. 147–151 (1995).

D. Débarre et al., "The role of gas–phase in the laser etching of Cu by $CCl_4$", *Applied Surface Science*, 96–98, pp. 453–456 (1996).

T. Gessner et al., "Copper Metalization Technology", COIN project, JESSI BT9B/ESPRIT 9021 pp. 1–23.

B. J. Howard et al., "Reactive ion etching of copper in $SiCl_4$–based plasmas", *Appl. Phys. Lett.*, 59(8), pp. 914–916 (Aug. 19, 1991).

Y. Igarishi et al., "High Realiability Copper Interconnects through Dry Etching Process", *Extended Abstracts of the 1994 International Conference on Solid State Devices and Materials*, Yokohama, pp. 943–945 (1994).

Y. Igarishi et al., "Thermal Stability of Interconnect of TiN/Cu/TiN Multilayered Structure", *Jpn. J. Appl. Phys.*, vol. 33, pp. 462–465 (1994).

Y. Igarishi et al., "Dry Etching Technique for Subquarter–Micron Copper Interconnects", *J. Electrochem. Soc.*, Vol. 142, No. 3, pp. L36–L37 (Mar. 1995).

A. Jain et al., "Thermal dry–etching of copper using hydrogen peroxide and hexafluoroacetylacetone", *Thin Solid Films*, 269, pp. 51–56 (1995).

H. Miyazaki et al., "Copper dry etching using $Cl_2$ gas as a single reactant and its application to ULSI", Semi Technology Symposium (Japan), Session 5, pp. 41–43 (Dec. 1996).

H. Miyazaki et al., "Copper dry etching with precise wafer–temperature control using $Cl_2$ gas as a single reactant", *J. Vac. Sci. Technol.* B 15(2), pp. 237–240 (Mar./Apr. 1997).

K. Ohno et al., "Reactive Ion Etching of Copper Films in a $SiCl_4$, $N_2$, $CL_2$ and $NH_3$ Mixture", *J. Electrochem. Soc.*, vol. 143, No. 12 (Dec. 1996).

K. Ohno et al., "Reactive Ion Etching of Copper Films in $SiCl_4$ and $N_2$ Mixture", *Japanese Journal of Applied Physics*, vol. 28, No. 6, pp. L1070–L1072 (Jun. 1989).

Y. Ohshita et al., "Lower temperature plasma etching of Cu using IR light irradiation", *Thin Solid Films*, 262, pp. 67–72 (1995).

J. J. Ritsko et al., "Laser–assisted chemical etching of copper", *Appl. Phys. Lett.*, 53(1), pp. 78–80 (Jul. 1988).

G. C. Schwartz et al., Reactive Ion Etching of Copper Films, *J. Electrochem. Soc.*, vol. 130, No. 8, pp. 1777–1779 (Aug. 1983).

S. Seo et al., "Characteristics of an Inductively Coupled $Cl_2$/Ar Plasma and Its Application to Cu Etching", *Electrochemical Society Proceedings*, vol. 95–4, pp. 327–338 (1995).

W. Sesselman et al., "Laser–Induced Desorption and Etching Processes on Chlorinated Cu and Solid CuCl Surfaces", *Appl. Phys.*, A41, pp. 209–221 (1986).

W. Sesselman et al., "The Interaction of Chlorine with Copper. I. Adsorption and surface reaction", *Surface Science*, 176, pp. 32–66 (1986).

W. Sesselman et al., "The Interaction of Chlorine with Copper. II. Bulk diffusion", *Surface Science*, 176, pp. 67–90 (1986).

C. Steinbruchel, "Patterning of Copper for Multilevel Metallization: Reactive Ion Etching and Chemical–Mechanical Polishing", *Applied Surface Science*, 91, pp. 139–146 (1995).

J. Torres, "Advanced Copper Interconnections for Silicon CMOS Technologies", *Applied Surface Science*, 91, pp. 112–123 (1995).

H. Winters, "Etch products from the reaction on $Cl_2$ with Al(100) and Cu(100) and $XeF_2$ with W(111) and Nb", *J. Vac. Sci. Technol.*, B3(1), pp. 9–15 (Jan./Feb. 1985).

H. Winters, "The etching of Cu(100) with $Cl_2$ ", *J. Vac. Sci. Technol.*, A3(3), pp. 786–790 (May/Jun. 1985).

Y. Ye et al., "0.35–Micron and Sub–0.35–Micron Metal Stack Etch in a DPS Chamber—DPS Chamber and Process Characterization", *Electrochemical Society Proceedings*, vol. 96–12, pp. 222–233 (1996).

U.S. patent application, Ser. No. 08/891,410 of Ye et al., filed Jul. 9, 1997.

Copy of Partial International Search (Annex to the Invitation to Pay Additioal Fees, dated Jan. 22, 1999 in corresponding PCT Application No. PCT/US98/16876, filed Aug. 13, 1998.

* cited by examiner

CONTROL OF PATTERNED ETCHING IN SEMICONDUCTOR FEATURES

This application is a divisional application of U.S. application Ser. No. 09/393,446, filed Aug. 9, 1999, now allowed, which is a continuation application of U.S. application Ser. No. 08/911,878, filed Aug. 13, 1997, and issued as U.S. Pat. No. 6,008,140 on Dec. 28, 1999.

BACKGROUND OF THE INVENTION

1. Field of the Invention

The present invention pertains to a particular chemistry which provides advantages in the pattern etching a copper layer on the surface of a semiconductor device substrate. In particular, the etched portion of a feature surface is protected from reactive species during the etching of adjacent feature surfaces.

2. Brief Description of the Background Art

In the multi level metallization architecture used in present day semiconductor devices, aluminum is generally used as the material of construction for interconnect lines and contacts. Although aluminum offers a number of advantages in ease of fabrication, as integrated circuit designers focus on transistor gate velocity and interconnect line transmission time, it becomes apparent that copper is the material of choice for the next generation of interconnect lines and contacts. In particular, when the aluminum wire size becomes smaller than 0.5 $\mu$m, the electromigration resistance and the stress migration resistance of aluminum becomes a problem area. In addition, when the feature size of an aluminum-based contact requires an aspect ratio of greater than 1:1, it is difficult to obtain planarization of the substrate during the application of the next insulating layer over the contact area of the substrate. Further, the resistivity of copper is about 1.4 $\mu\Omega$cm, which is only about half of the resistivity of aluminum.

There are two principal competing technologies under evaluation by material and process developers working to enable the use of copper. The first technology is known as damascene technology. In this technology, a typical process for producing a multilevel structure having feature sizes in the range of 0.5 micron ($\mu$m) or less would include: blanket deposition of a dielectric material; patterning of the dielectric material to form openings; deposition of a diffusion barrier layer and, optionally, a wetting layer to line the openings; deposition of a copper layer onto the substrate in sufficient thickness to fill the openings; and removal of excessive conductive material from the substrate surface using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995) 139–146.

The competing technology is one which involves the patterned etch of a copper layer. In this technology, a typical process would include deposition of a copper layer on a desired substrate (typically a dielectric material having a barrier layer on its surface); application of a patterned hard mask or photoresist over the copper layer; pattern etching of the copper layer using wet or dry etch techniques; and deposition of a dielectric material over the surface of the patterned copper layer, to provide isolation of conductive lines and contacts which comprise various integrated circuits. An advantage of the patterned etch process is that the copper layer can be applied using sputtering techniques well known in the art The sputtering of copper provides a much higher deposition rate than the evaporation or CVD processes typically used in the damascene process, and provides a much cleaner, higher quality copper film than CVD. Further, it is easier to etch fine patterns into the copper surface and then deposit an insulating layer over these patterns than it is to get the barrier layer materials and the copper to flow into small feature openings in the top of a patterned insulating film.

Each of the above-described competing technologies has particular process problems which must be solved to arrive at a commercially feasible process for device fabrication. In the case of the damascene process, due to difficulties in the filling of device feature sizes of 0.25 $\mu$m and smaller (and particularly those having an aspect ratio greater than one) on the surface of the dielectric layer, the method of choice for copper deposition is evaporation (which is particularly slow and expensive); or chemical vapor deposition, or CVD (which produces a copper layer containing undesirable contaminants and is also a relatively slow deposition process). Just recently, electroplating has been investigated as a method for copper deposition.

Regardless of the technique used to deposit copper, the CMP techniques used to remove excess copper from the dielectric surface after deposition create problems. Copper is a soft material which tends to smear across the underlying surface during polishing. "Dishing" of the copper surface may occur during polishing. As a result of dishing, there is variation in the critical dimensions of conductive features. Particles from the slurry used, during the chemical mechanical polishing process may become embedded in the surface of the copper and other materials surrounding the location of the copper lines and contacts. The chemicals present in the slurry may corrode the copper, leading to increased resistivity and possibly even corrosion through an entire wire line thickness. Despite the number of problems to be solved in the damascene process, this process is presently viewed in the industry as more likely to succeed than a patterned copper etch process for the following reasons.

The patterned etch process particularly exposes the copper to corrosion. Although it is possible to provide a protective layer over the etched copper which will protect the copper from oxidation and other forms of corrosion after pattern formation, it is critical to protect the copper during the etch process itself to prevent the accumulation of involatile corrosive compounds on the surface of the etched copper features. These involatile corrosive compounds cause continuing corrosion of the copper even after the application of a protective layer over the etched features.

Wet etch processes have been attempted; however, there is difficulty in controlling the etch profile of the features; in particular, when the thickness of the film being etched is comparable to the, minimum pattern dimension, undercutting due to isotropic etching becomes intolerable. In addition, there is extreme corrosion of the copper during the etch process itself.

Plasma etch techniques provide an alternative. A useful plasma etch process should have the following characteristics: It should be highly selective against etching the mask layer material; it should be highly selective against etching the material under the film being etched; it should provide the desired feature profile (e.g. the sidewalls of the etched feature should have the desired specific angle); and the etch rate should be rapid, to maximize the throughput rate through the equipment.

Until very recently etch rates obtained by purely physical bombardment were typically about 300 Å–500 Å per minute or less, as described by Schwartz and Schaible, *J. Electrochem. Soc.,* Vol. 130, No. 8, p. 1777 (1983) and by H. Miyazaki et al., *J. Vac. Sci. Technol.* B 15(2) p.239 (1997), respectively. Recently, applicants have been able to improve on the etch rates achievable by purely physical bombardment so that etch rates as high as 5,000 Å per minute can be achieved. Further, the selectivity between copper and materials commonly used as barrier layers, insulating layers and patterning masks is more than satisfactory. This technology is disclosed in detail in U.S. Pat. No. 6,010,603, issued to Ye et al. on Jan. 4, 2000. However, etch rate and selectivity must be accompanied by the ability to etch a pattern having the desired cross-sectional profile. To improve etch profile, it is necessary to use a limited amount of chemical reactants during the etch process.

The chemical reactants must be very carefully selected to react with the copper and create volatile species which can then be removed by application of vacuum to the process chamber. However, when such chemical reactants are used, corrosion is a major problem during the fabrication, as copper does not form any self passivating layer like aluminum does. In particular, oxidation of copper increases resistivity; further, in the case of copper interconnect lines, the whole wire line may corrode all the way through, resulting in device failure. As described in U.S. Pat. No. 6,010,603, referenced above, it is possible to use a limited concentration of particular halogen-based reactants in combination with physical bombardment, when physical bombardment is the controlling etch mechanism and avoid corrosion of the copper by the reactive species used to assist in the etch process.

There are some etch profiles for which etching in the physical bombardment regime does not provide the best result. In addition, applicants have discovered that it is possible to obtain etch rates which are higher than those obtained to date in the physical bombardment regime and still avoid corrosion of the etched copper. Typically, a chlorine-comprising gas is used in the reactive ion etch processing of the copper. Although the chlorine provides acceptable etch rates, it causes the copper to corrode rapidly. The chlorine reacts very fast, but produces reaction by-products which are not volatile. These byproducts remain on the copper surface, causing corrosion over the entire etched surface. The byproducts can be made volatile subsequent to the etch step by treatment with chemical species which create a volatile reaction product, but by this time the corrosion is already extensive.

An example of a treatment to remove chlorides and fluorides remaining after the etch of a conductive layer is provided in U.S. Pat. No. 4,668,335 to Mockler et al., issued May 26, 1987. In Mockler et al., the workpiece (wafer) is immersed in a strong acid solution, followed by a weak base solution after the etch of an aluminum-copper alloy, to remove residual chlorides and fluorides remaining on the surface after etching. Another example is provided in U.S. Pat. No. 5,200,031 to Latchford et al., issued Apr. 6, 1993. In Latchford et al, a process is described for removing a photoresist remaining after one or more metal etch steps which also removes or inactivates chlorine-containing residues, to inhibit corrosion of remaining metal for at least 24 hours. Specifically, $NH_3$ gas is flowed through a microwave plasma generator into a stripping chamber containing the workpiece, followed by $O_2$ gas (and optionally $NH_3$ gas), while maintaining a plasma in the plasma generator.

Attempts have been made to reduce the corrosion by introducing additional gases during the etch process (which can react with the corrosion causing etch byproducts as they are formed). In addition, gaseous compounds which can react to form a protective film over the sidewalls of etched features as they are formed have been added during the etching process and after the etch process. However, residual corrosion continues to be a problem and the protective film, while protecting from future contact with corrosive species, may trap corrosive species already present on the feature surface.

An example of the formation of a passivating film on pattern sidewalls is presented by J. Torres in "Advanced copper interconnections for silicon CMOS technologies", *Applied Surface Science,* 91 (1995) 112–123. Other examples are provided by Igarashi et al. in: "High Reliability Copper Interconnects through Dry Etching Process", Extended Abstracts of the 1994 International Conference on Solid State Devices and Materials, Yokohama, 1994, pp.943–945; in "Thermal Stability of Interconnect of TiN/cutin Multilayered Structure", *Jpn. J. Appl. Phys.* Vol. 33 (1994) Pt. 1, No. 1B; and, in "Dry Etching Technique for Subquarter-Micron Copper Interconnects", *J. Electrochem. Soc.,* Vol. 142, No. 3, March 1995. In this 1995 article, Yasushi Igarashi et al. show photomicrographs of cross-sectional views of the subquarter-micron etched features. In reviewing the article, applicants noticed that although the exterior walls of the feature appear to be solid, there appears to be interior hollow areas within the feature where the copper line has been eroded away. Applicants subsequently reproduced this effect, demonstrated by the comparative example (Example 3) presented subsequently herein. Apparently, reactive chlorine species are trapped interior to the passivating film formed on the wall and these species react with and erode the copper beneath the passivating film.

Passivating films are used to protect the walls of forming features during the etching of aluminum. Such films are generally used to protect the walls of etched features from further etching by incident reactive species during continued vertical etching of the feature through a mask. Typically the protective film comprises an oxide or a nitride or a polymeric material, or a combination thereof. In the case of aluminum, aluminum oxide forms a cohesive, continuous protective film very rapidly. This rapid formation of a continuous protective film protects the interior of the etched feature from exposure to significant amounts of the reactive species which could cause corrosion interior to the etched wall. However, in the case of copper, there is no similar rapidly-formed film which prevents reactive species from reaching the copper surface and being trapped there by a slowly-formed "passivating" film. It appears that the passivating films of the kind described by Igarashi et al. in their March 1995 article trap reactive species inside the feature walls and these reactive species corrode away the copper interior to the feature walls.

If the patterned etch technique is to be used for fabrication of semiconductor devices having copper interconnects, contacts, and conductive features in general, it is necessary to find an etch method which does not create immediate corrosion or a source of future corrosion.

In addition to controlling corrosion, it is necessary to control the profile of the etched pattern. An example of a technique used for obtaining a high etch rate and highly directional reactive etching of patterned copper films copper is described by Ohno et al in "Reactive Ion Etching of Copper Films in a $SiCl_4$, $N_2$, $Cl_2$, and $NH_3$ Mixture", *J. Electrochem. Soc.,* Vol. 143, No. 12, December 1996. In particular, the etching rate of copper is increased by increasing the $Cl_2$ flow rate at temperatures higher than 280° C. However, the addition of $Cl_2$ is said to cause undesirable side etching of the Cu patterns. $NH_3$ is added to the gas mixture to form a protective film that prevents side wall etching. The etch gas mixture which originally contained $SiCl_4$ and $N_2$ was modified to contain $SiCl_4$, $N_2$, $Cl_4$, and $NH_3$.

Thus, protective films formed during etching are used by some practitioners skilled in the art to reducing corrosion (as described above) and by others for controlling the directional etching of the pattern surface. In either case, although the formation of such a protective film may work well for aluminum etching, it may be harmful in the case of copper etching for the reasons previously described.

Toshiharu Yanagida, in Japanese Patent Application No. 4-96036, published Oct. 22, 1993, describes a method of dry etching of a copper material in the temperature range at which a polymeric resist mask can be used (below about 200° C.). Etching using a polymeric resist mask is said to be preferable so that the presence of oxygen (present in a silicon oxide hard masking material which can withstand higher temperatures) can be avoided. The oxide causes harmful corrosion of the copper, producing copper oxides which increase the resistivity of etched copper features. In particular, the Yanagida reference describes the use of hydrogen iodide (HI) gas and combinations of HI gas with chloride and/or fluoride compounds to achieve etching at substrate temperatures below about 200° C.

FIGS. 5A and 5B illustrate the kind of corrosion which typically is experienced during the reactive ion etching of copper. The pattern etched was one of lines and spaces, wherein the lines and spaces were approximately 0.5 $\mu$m in width looking at a cross-sectional profile of the pattern. The details of the preparation of the etched substrates shown in FIGS. 5A and 5B will be discussed in detail subsequently herein, for comparative purposes. For now, the important features to note are that the copper lines 510 which appear to be solid looking at the exterior walls 516 are actually hollow in the interior, where the copper 520 remaining after etching is surrounded by vacant space 522. The vacant space is created by the harmful copper reactions we are calling "corrosion". Corrosion is caused when the copper reacts with oxygen or with other reactants present in the process vessel to produce undesirable by-products. Corrosion also includes reaction with halogens which are typically used as etchant reactants, but the reaction occurs at an undesired rate so that the desired etched feature profile cannot be obtained. FIGS. 5A and 5B are representative of this latter case.

We have discovered a particular etch chemistry which makes it possible to etch micron and submicron sized copper features on a semiconductor substrate while maintaining the integrity of the etched copper feature.

SUMMARY OF THE INVENTION

We have discovered that copper can be pattern etched in a manner which provides the desired feature dimension and integrity, at acceptable rates, and with selectivity over adjacent materials. To provide for feature integrity, the portion of the copper feature surface which has been etched to the desired dimensions and shape must be protected during the etching of adjacent feature surfaces. This is particularly important for feature sizes less than about 0.5 $\mu$m, where presence of even a limited amount of a corrosive agent can eat away a large portion of the feature. To avoid the trapping of reactive species which can act as a corrosive agent interior of the etched copper surface, hydrogen is applied to that surface. Hydrogen is adsorbed on the copper exterior surface and may be absorbed into the exterior surface of the copper, so that it is available to react with species which would otherwise penetrate that exterior surface and react with the copper interior to that surface. Sufficient hydrogen must be applied to the exterior surface of the etched portion of the copper feature to prevent incident reactive species present due to etching of adjacent feature surfaces from penetrating the previously etched feature exterior surface.

Although any plasma feed gas component comprising hydrogen, which is capable of generating sufficient amounts of hydrogen, may be used, the most preferred embodiment of the invention provides for the use of a component which contains both hydrogen and halogen. Preferred examples are hydrogen chloride (HCl) and/or hydrogen bromide (HBr), which are used as the principal source of the reactive species for etching copper. Dissociation of the HCl and/or HBr provides large amounts of hydrogen for protection of etched copper surfaces, thereby preventing penetration by reactive species adjacent the etched surface. Additional hydrogen gas may be added to the plasma feed gas which comprises the HCl and/or HBr when the reactive species density in the etch process chamber is particularly high. The hydrogen-releasing, halogen-comprising plasma feed gas component may be used as an additive (producing less than 40% of the plasma-generated reactive species) in combination with other plasma etching species.

When HCl and/or HBr is used as the principal source of reactive species for the copper etching, the HCl or HBr accounts for at least 40%, and more preferably at least 50%, of the reactive species generated by the plasma. Most preferably, HCl or HBr accounts for at least 80% of such reactive species. Other reactive species may be used for purposes of feature surface passivation during etching or for purposes of feature surface protection after completion or near the completion of feature surface etching. The species added for surface passivation or surface protection during etching of the copper feature preferably make up 30% or less, or more preferably make up 10% or less of the plasma-generated reactive species.

In particular, the preferred method for the patterning of copper on a substrate surface includes the following steps:

a) supplying to a plasma etch process chamber a plasma feed gas including hydrogen in the form of HCl, or HBr, or $H_2$, or a combination thereof, in an amount which provides plasma-generated dissociated hydrogen in an amount sufficient to form a protective layer over an exterior portion of a copper feature which has been etched to the desired dimensions; and b) etching said copper features to provide said desired pattern.

In addition to including additional species-generating gases for purposes of passivating various surfaces and reacting with potentially corrosive species on the semiconductor substrate, such as oxygen, gaseous hydrogen-containing molecules may be used to adjust the ratio of hydrogen to halogen in the plasma. By way of example, additional gases which may be added to the plasma feed gas include $CH_4$, $CH_3F$, $BCl_3$, $N_2$, $NH_3$, $SiCl_4$, $CCl_4$, and $CHF_3$.

Plasma feed gases may include additional inert (non-reactive with copper) gases such as argon, helium, or xenon, to enhance the ionization, or dissociation, or to dilute the reactive species.

In a particularly preferred embodiment of the present invention, copper is patterned on a substrate surface for use in semiconductor fabrication, wherein the method steps comprise:

a) supplying a plasma feed gas to a plasma etch process chamber, or other controlled environment for the production of a plasma, wherein said feed gas includes HCl, or HBr, or $H_2$, or a combination thereof, wherein the amount of HCl or HBr is sufficient that at least 40%, and preferably at least 50%, of the total reactive species present in the plasma are supplied by the HCl or HBr or combination thereof;

b) using a plasma created from the plasma feed gas in a manner which provides a reactive species density sufficient to enable a copper etch rate of at least about 2,000 Å per minute.

The amount of $H_2$ gas added to the feed gas will depend on the density of reactive species present at the surface of the copper during etching. Hydrogen gas may be added to the plasma feed gas for only a portion of the feature etch time period.

As previously mentioned, other gases capable of generating reactive species for purposes of surface passivation or as an oxygen "getter", such as $N_2$ or $BCl_3$, respectively, may be used in the plasma feed gas. In addition, inert gases such as argon may be used.

The critical feature is the availability of hydrogen at the feature surface during the etching process. The use of HCl or HBr as the primary source of the copper etchant reactive species provides for the availability of dissociated, reactive hydrogen, as the hydrogen is released upon creation of the plasma and is adsorbed on or absorbed near the copper surface during etching, where it buffers the reaction of the chlorine or bromine species with the copper surface which is being etched. This protects the interior of the copper feature from subsequent corrosion while permitting etch rates for adjacent copper surfaces of at least 2,000 Å per minute. To enhance this protection of the etched copper feature surface, hydrogen may be provided from plasma-generated species When the etch process is carried out typically oxygen-comprising species are generated from a silicon oxide hard mask or a photoresist, or from an insulating layer present on the substrate. Under these circumstances, it is advantageous to add boron trichloride ($BCl_3$) or an equivalent oxygen scavenger.

DETAILED DESCRIPTION OF THE PREFERRED EMBODIMENTS

Figure 1:
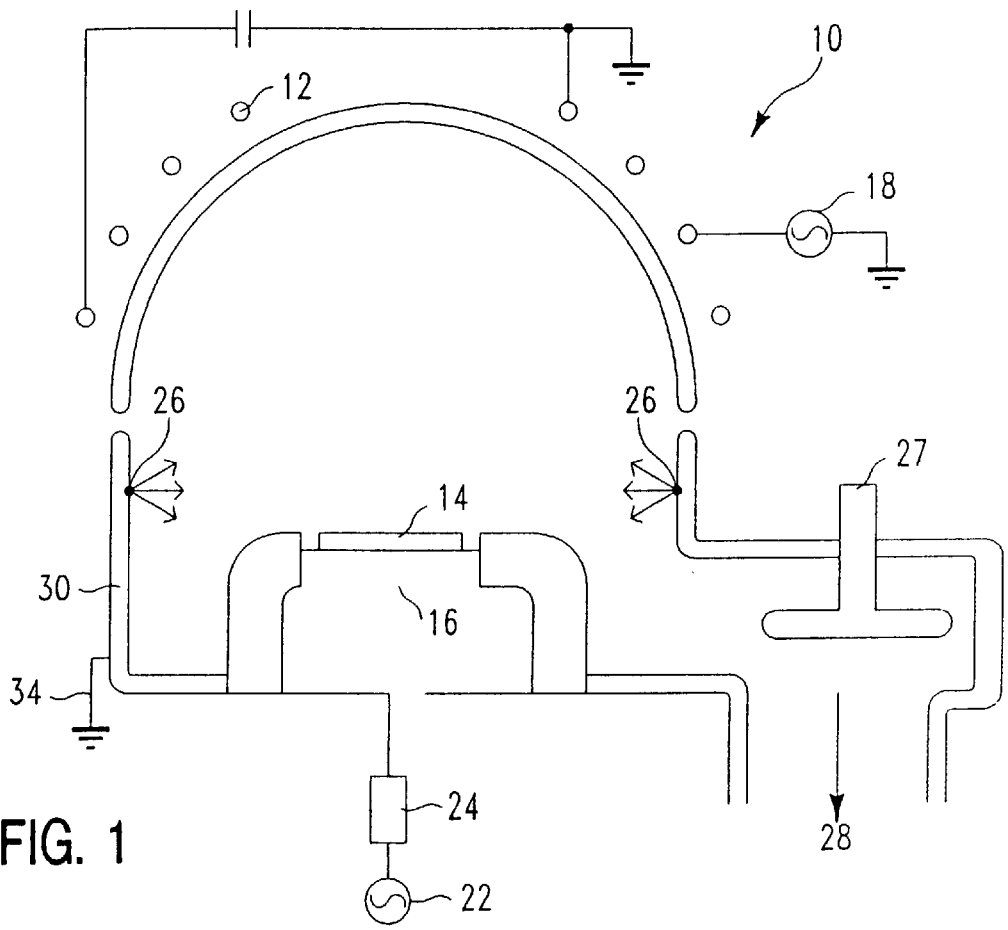
FIG. 1 is a schematic illustrating a decoupled plasma source (DPS) etching chamber of the kind used during the patterned etching of copper as described in the preferred embodiments of the present invention.

We have discovered that copper can be pattern etched in a manner which provides the desired feature dimension and integrity, at acceptable rates, and with selectivity over adjacent mask materials. To provide for feature integrity, the portion of the copper feature surface which has been etched to the desired dimensions and shape must be protected during the etching of adjacent feature surfaces. To avoid the trapping of reactive species interior of the etched copper surface, hydrogen is applied to that surface. The most preferred embodiment of the invention provides for the use of hydrogen chloride (HCl) and/or hydrogen bromide (HBr) as the sole or principal source of the reactive species used in etching copper. Dissociation of the HCl and/or HBr provides the large amounts of hydrogen necessary to protect the copper feature etched surfaces from penetration by reactive species adjacent the etched surface. Additional hydrogen gas may be added to the plasma feed gas which comprises the HCl and/or HBr when the reactive species density in the etch process chamber is particularly high.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by a glow discharge, and a reference to "copper" includes alloys thereof.

Specific terminology of particular importance to the description of the present invention is defined below.

The term "anisotropic etching" refers to etching which does not proceed in all directions at the same rate. If etching proceeds exclusively in one direction (e.g. only vertically), the etching process is said to be completely anisotropic.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "bias power" refers to the power used to control ion bombardment energy and the directionality of ions toward a substrate.

The term "copper" refers to copper and alloys thereof, wherein the copper content of the alloy is at least 80 atomic % copper. The alloy may comprise more than two elemental components.

The term "feature" refers to metal lines and openings on a substrate, and other structures which make up the topography of the substrate surface.

The term "glow discharge sputtering" refers to a mechanism in which atoms are dislodged from a surface which is to be sputtered, by collision with high energy particles which are generated by a glow discharge, where the glow discharge is a self-sustaining type of plasma. The high energy particles may be energetic atoms as well as energetic molecules.

The term "ion bombardment" refers to physical bombardment by ions (and other excited species of atoms which are present with the ions) to remove atoms from a surface, where physical momentum transfer is used to achieve the atom removal.

The term "isotropic etching" refers to an etching process where etching can proceed in all directions at the same rate.

The term "plasma" refers to a partially ionized gas containing an equal number of positive and negative charges, as well as some other number of non-ionized gas particles.

The term "source power" refers to the power used to generate ions and neutrals whether directly in an etching chamber or remotely as in the case of a microwave plasma generator.

The term "substrate" includes semiconductor materials, glass, ceramics, polymeric materials, and other materials of use in the semiconductor industry.

II. An Apparatus for Practicing the Invention

The etch process was carrier out in a Centura® Integrated Processing System available from Applied Materials, Inc. of Santa Clara, Calif. The system is shown and described in U.S. Pat. No. 5,186,718, the disclosure of which is hereby incorporated by reference. This equipment included a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96–12, pp. 222–233 (1996) which is hereby incorporated by reference. The plasma processing chamber enables the processing of an 8 inch (200 mm) diameter silicon wafer while providing control over critical dimension variation.

As described in the Yan Ye et al. paper referenced above, metal etch is an ion enhanced chemical process, and in addition to selecting a proper process gas, it is also necessary to control a number of process parameters such as bias power, source power, pressure, flow rate and wafer temperature. Wafer temperature is a function of plasma source power and helium (heat transfer gas) pressure at the backside of a wafer (substrate), as well as other variables. A higher He pressure (for a non-heated electrostatic chuck), lowers the substrate surface temperature. Uniform wafer temperature is achieved through optimization of electrostatic chuck design and cathode design. Wafer temperature is important since critical dimension variation is sensitive to a change in wafer temperature. This indicates that feature sidewall passivation is an important mechanism for critical dimension control.

A schematic of the processing chamber is shown in FIG. 1A which shows an etching process chamber 10, which is constructed to include at least one inductive coil antenna segment 12 positioned exterior to the etch process chamber 10 and connected to a radio frequency (RF) power generator 18. Interior to the process chamber is a substrate 14 support pedestal 16 which is connected to an RF frequency power generator 22 through an impedance matching network 24, and a conductive chamber wall 30 which serves as the electrical ground 34 for the offset bias which accumulates on the substrate 14 as a result of the RF power applied to the substrate support pedestal 16.

The semiconductor substrate 14 is placed on the support pedestal 16 and gaseous components are fed into the process chamber through entry ports 26. A plasma is ignited in process chamber 10 using techniques well known in the industry. Pressure interior to the etch process chamber 10 is controlled using a vacuum pump (not shown) and a throttle valve 27 connected to a process chamber gas exit line 28. The temperature on the surface of the etch chamber walls is controlled using liquid-containing conduits (not shown) which are located in the walls of the etch chamber 10. The temperature of the semiconductor substrate was controlled by bombarding the surface of the substrate with an argon plasma to reach initial temperature and subsequently, during the etch process by impact of plasma species on the substrate surface. For experimental purposes, it was desired to maintain the substrate temperature above about 150° C. and below about 350° C., which we were able to do relying solely upon surface bombardment of the substrate. The surface of the etching chamber 10 walls was maintained at about 80° C. using the cooling conduits previously described. In the case of a production process, preferably, the substrate support platen provides for backside heating or cooling of the substrate.

III. Achieving Patterned Copper Etch Using the Method of the Present Invention The Examples provided below for the etching of patterned copper were practiced in the Centura® Integrated Processing System previously described.

The substrate was a silicon wafer overlaid by a silicon oxide dielectric layer. Typically, a 500 Å thick barrier layer of tantalum was applied over the silicon oxide dielectric layer. A 5,000 Å thick layer of copper was sputter deposited over the barrier layer. A 250 Å thick layer of tantalum was applied over the copper layer, and a 5,000 Å thick patterned silicon oxide hard mask was applied over the tantalum layer. When the substrate varied from this general description, the variance is specified in the particular preferred embodiment described.

A plasma was created in the etch chamber using standard techniques, with the composition of the plasma feed gas being as specified. The power to the external RF coil is specified for each Example, with the frequency being about 2 MHz in all cases. A substrate offset bias was created by application of RF power at a frequency of about 13.56 MHz and a wattage above about 50 W (equivalent to a bias voltage of about 20 V). Preferably the power to the support platen ranges from about 400 W to about 800 W.

The pressure in the etch chamber ranged between about 0.1 mT to 100 mT, and was preferably below about 20 mT. The temperature on the substrate surface ranged from about 130° C. to about 300° C., while the wall temperature of the etch chamber was preferably at least 50 degrees lower than the substrate temperature. Typically the etch chamber surface was maintained at about 80° C. or less.

EXAMPLE ONE

Etch Rate

Figure 2A:
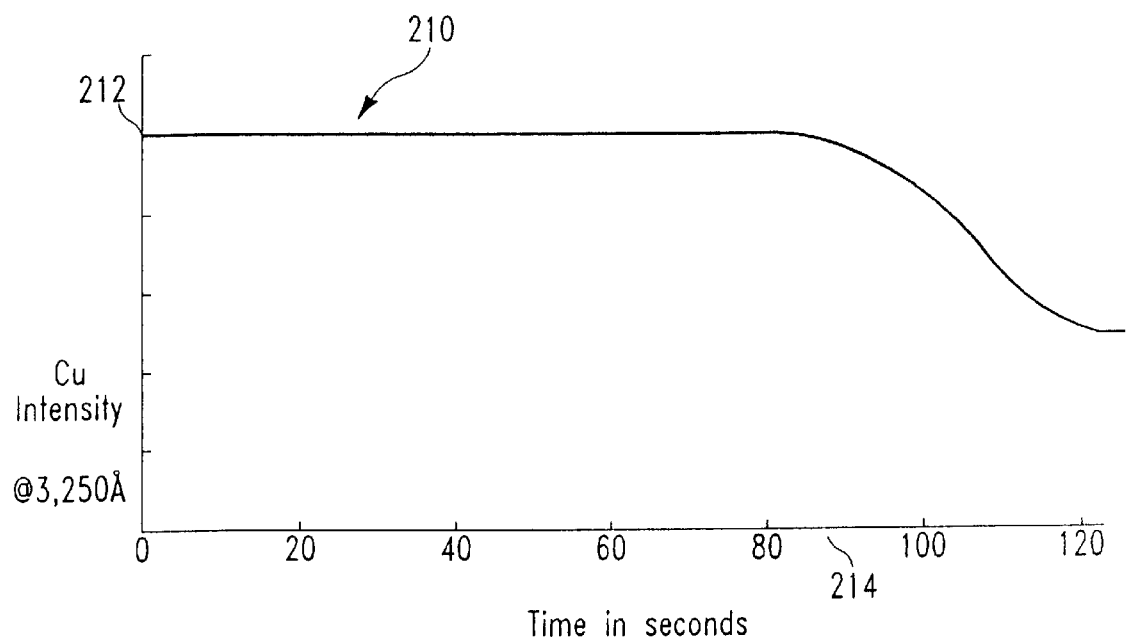
FIG. 2A illustrates the change in copper intensity in the etch plasma during the etching of a pattern of 0.5 μm wide lines and spaces into the surface of a copper film, where the principal source for the copper-etching reactive species is HCl.

FIG. 2A shows the etch rate curve 210 for the etching of a copper film to form a pattern of 0.35 μm wide lines and spaces using HCl as the principal source of copper etchant reactive species. In particular, the base of the substrate etched was a silicon wafer having a thermal oxide coating on its surface. A 500 Å thick layer of tantalum was applied over the thermal oxide; a 18,000 Å thick layer of copper was applied over the tantalum layer; a 250 Å thick tantalum nitride layer was applied over the copper layer; and, finally, a silicon oxide hard mask 5,000 Å thick was applied over the tantalum nitride layer.

This stack of materials was etched in the Centura® Integrated Processing System previously described. The plasma feed gas to the process chamber was 100 sccm of HCl, 25 sccm of $N_2$, and 5 sccm $BCl_3$. The substrate temperature during etching was about 200° C., with the process chamber walls at about 80° C. The process chamber pressure during etching was 20 mT. The source power to the plasma inducing coil was about 1,500 W @ 2 MHz and the bias power to the substrate support platen was about 500 W @ 13.56 MHz. A plasma was ignited using techniques standard in the art, and the presence of any copper emissions in the plasma were monitored using an optical sensor measuring at a wavelength of about 3,250 Å. FIG. 2A shows the optical emission intensity 212 for copper appearing in the plasma, as a function of time 214 in seconds. At about 90 seconds, the intensity of the copper in the plasma began dropping, indicating that the copper etching area was depleting. Since etching is slower is some areas than in others, the copper in the plasma gradually decreased, and the curve 210 leveled out at about 120 seconds, indicating that the etch was completed in all areas. Applicants believe the average time for completion of etching to be about 105 seconds. Using 105 seconds as the time for completion of etching, the calculated etch rate is about 10,000 Å per minute or about 1.0 μm per minute.

Figure 2B:
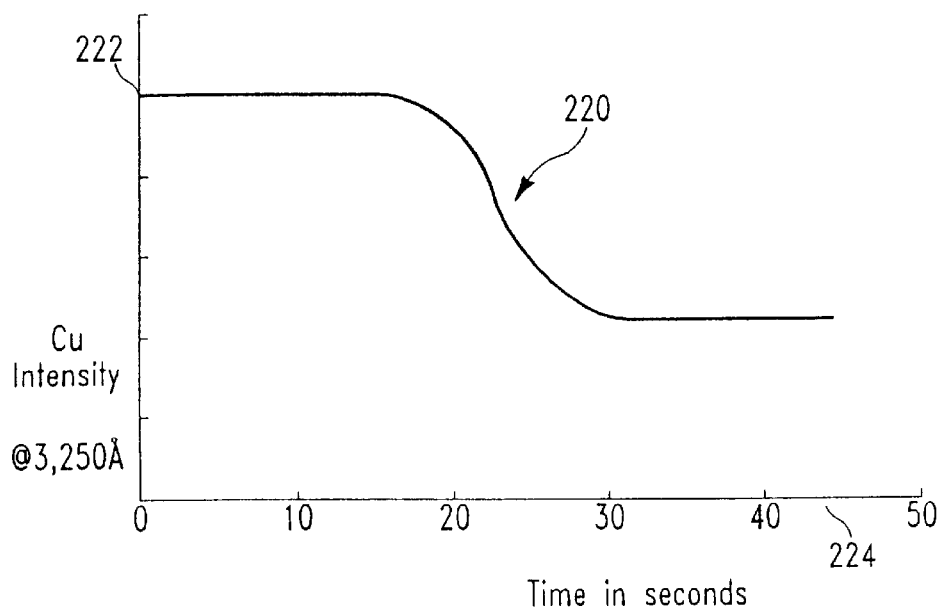
FIG. 2B illustrates the change in copper intensity in the etch plasma during the etching of a pattern of 0.5 μm wide lines and spaces into the surface of a copper film, where the principal source for the copper-etching reactive species is HBr.

FIG. 2B shows the etch rate curve 220 for the etching of a copper film to form a pattern of 0.35 μm wide lines and spaces using HBr as the principal source of copper etchant reactive species. In particular, the base of the substrate etched was a silicon wafer having a thermal oxide coating on its surface. A 500 Å thick layer of tantalum was applied over the thermal oxide; a 5,000 Å thick layer of copper was applied over the tantalum layer; a 250 Å thick tantalum nitride layer was applied over the copper layer; and, finally, a silicon oxide hard mask 5,000 Å thick was applied over the tantalum nitride layer.

This stack of materials was etched in the Centura® Integrated Processing System previously described. The plasma feed gas to the process chamber was 100 sccm of HBr, 25 sccm of $N_2$, and 5 sccm $BCl_3$. The substrate temperature during etching was about 200° C., with the process chamber walls at about 80° C. The process chamber pressure during etching was 20 mT. The source power to the plasma inducing coil was about 1,500 W and the bias power to the substrate support platen was about 500 W. A plasma was ignited using techniques standard in the art, and copper emissions appearing in the plasma were monitored using an optical sensor measuring at a wavelength of about 3,250 Å. FIG. 2B shows the optical emission intensity reading 222 for the copper appearing in the plasma, as a function of time 224 in seconds. Since a pattern was etched, again, the completion of copper etch was indicated, by a drop in the copper intensity reading over time. At the end of 20 seconds, the amount of copper began to drop, indicating that the majority of the etching was complete, with curve 220 leveling out to show no copper generated at about 30 seconds. Applicants believe the average time for completion of etching to be about 25 seconds. Using 25 seconds as the time for completion of etching, the calculated etch rate is about 12,000 Å per minute or about 1.2 μm per minute.

As a part of determining the effect of process variables on etch rate, the effect of process chamber pressure, plasma source power, and bias power were investigated. In particular, HCl was the principal source of etchant reactive species; the plasma feed gas was of the composition specified with reference to FIG. 2A above; the substrate stack was the same; the pattern etched was the same; and all process variables were the same with the exception of the variable investigated.

As a matter of importance, the preferred embodiments described above were carried out at a substrate temperature of about 200° C., and preferably the process is carried out at a temperature of at least about 200° C. However, the process works at temperatures above about 130° C. We have yet to determine the highest recommended temperature; however, one skilled in the art will appreciate that at higher temperatures other materials within the substrate are affected, thermal expansion differences can cause problems, and that there needs to be an optimization of substrate temperature depending on the device and the feature being fabricated. In any case, the substrate temperature should not exceed about 400° C.

Figure 3A:
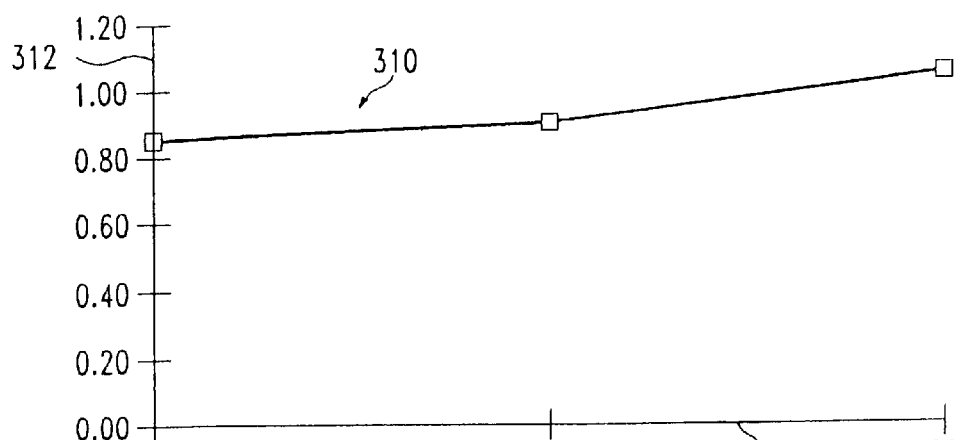
FIG. 3A illustrates the etch rate in μm per minute for a pattern of 0.5 μm wide lines and spaces into the surface of a copper film, as a function of etch chamber pressure. The feed gas to the etch chamber included HCl, $N_2$, and $BCl_3$.

Curve 310 of FIG. 3A shows the etch rate 312 as a function of process chamber pressure 314, with the etch rate increasing with an increase in chamber pressure, at least up to 20 mT.

Figure 3B:
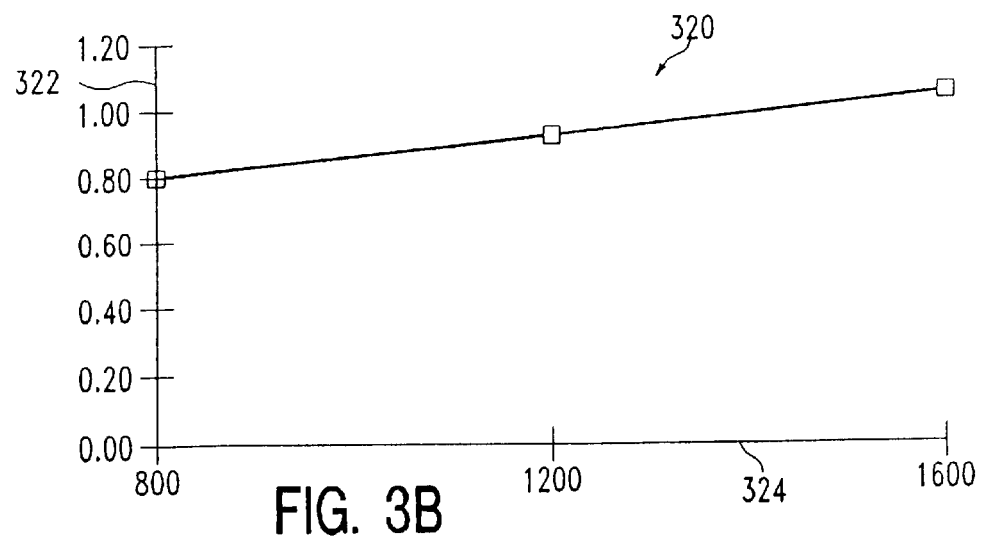
FIG. 3B illustrates the etch rate for the same patterned copper film as that described with reference to FIG. 3A, but as a function of source power.

Curve 320 of FIG. 3B shows the etch rate 322 as a function of plasma source power 324, with the etch rate increasing with an increase in plasma source power, at least up to 1,600 W.

Figure 3C:
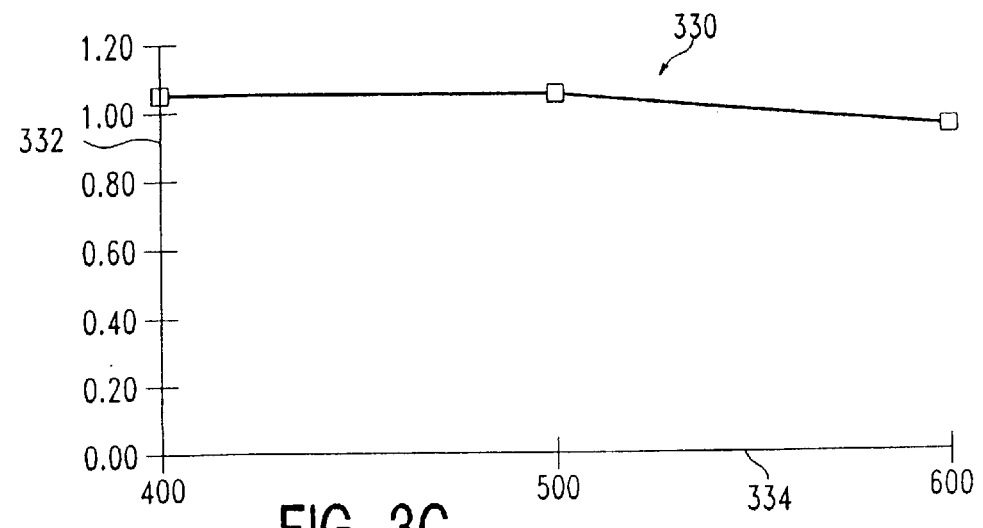
FIG. 3C illustrates the etch rate for the same patterned copper film as that described with reference to FIG. 3A, but as a function of bias power.

Curve 330 of FIG. 3C shows the etch rate 332 as a function of bias power 334, with the etch rate slightly decreasing with an increase in bias power, at least up to 600 W. This is an unexpected result It may be that the higher bias power is causing the deposition of a species at the surface of the patterned spaces where etching is occurring, and this species is inhibiting the etching of the copper. However, by adjusting other variables such as process chamber pressure and plasma source power, the shape of this curve may be altered.

We also investigated the variable of feed gas composition, where the sccm of HCl was decreased to 75 or 50 or 25 sccm with other feed gas flow rates held almost constant at the values previously specified for an HCl flow rate of 100 sccm. We discovered that the etch rate was only marginally affected, with a slight increase in etch rate with increasing HCl flow rate. Based on this discovery, we have concluded that, for HCl flow rates above about 25 sccm (and under the process conditions described), it is the surface reaction rate which controls the etch rate, rather than the concentration of reactive species in the plasma or the transfer rate of those species to the surface of the copper.

EXAMPLE TWO

Selectivity

We have determined that, using the substrate and process variables specified with reference to FIG. 2A, the selectivity ratio of copper to silicon oxide hard mask is about 4:1 (i.e., copper etches four times faster than the hard mask).

Further, the effect of process variables on this selectivity were investigated. In particular, the effect of process chamber pressure, plasma source power, and bias power were investigated. Again, HCl was the principal source of etchant reactive species; the plasma feed gas was of the composition specified with reference to FIG. 3A above; the substrate stack was the same; the pattern etched was the same; and all process variables were the same with the exception of the variable investigated.

Figure 4A:
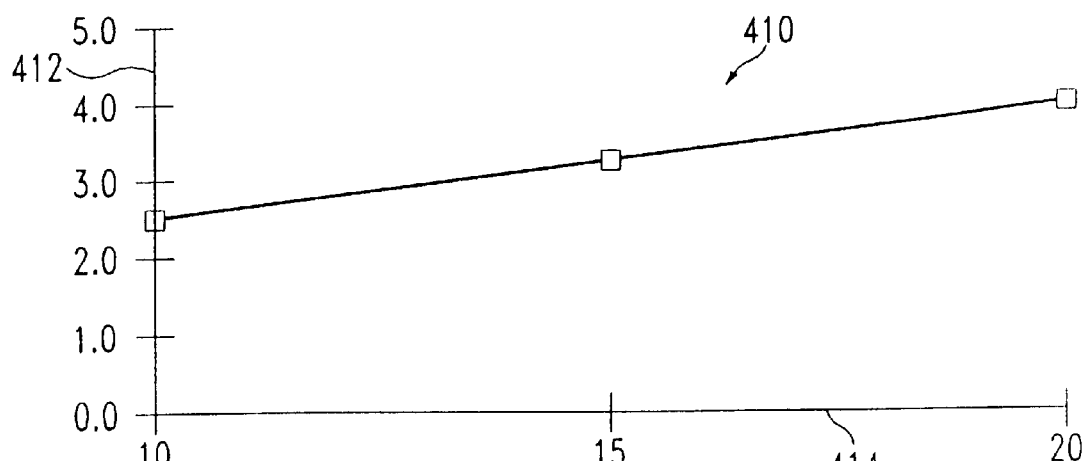
FIG. 4A illustrates the selectivity of copper relative to the patterning mask, shown as the ratio of copper etch rate to silicon oxide etch rate for a standard test pattern of various width lines and spaces, as a function of etch chamber pressure.

Curve 410 of FIG. 4A shows the selectivity ratio 412 of copper to silicon oxide hard mask as a function of process chamber pressure 414, with the selectivity ratio increasing with an increase in chamber pressure, at least up to 20 mT.

Figure 4B:
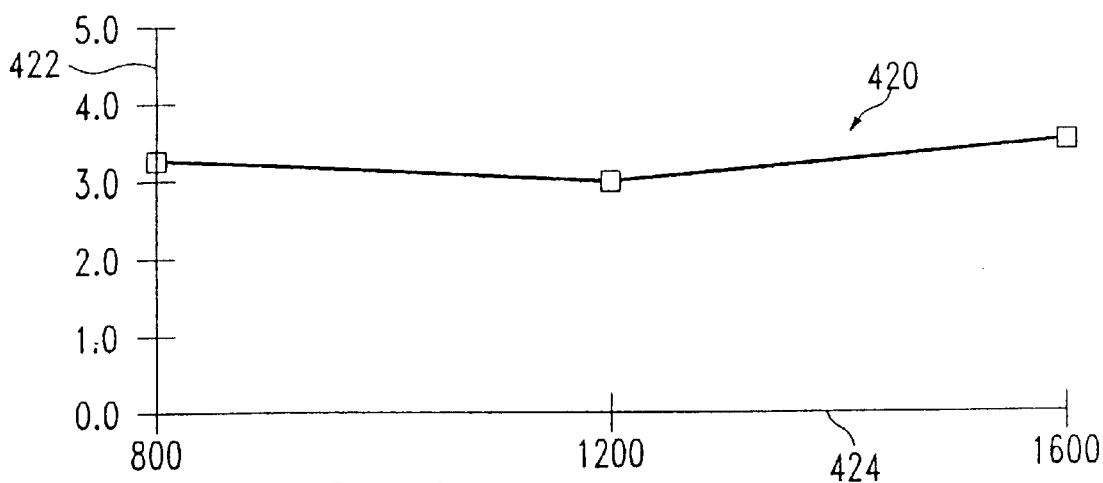
FIG. 4B illustrates the selectivity of copper relative to patterning mask, shown as the ratio of copper etch rate to silicon oxide etch rate for the same test pattern as that described with reference to FIG. 4A, but as a function of source power.

Curve 420 of FIG. 4B shows the selectivity ratio 422 as a function of plasma source power 424, with the selectivity ratio increasing with an increase in plasma source power, at least up to 1,600 W.

Figure 4C:
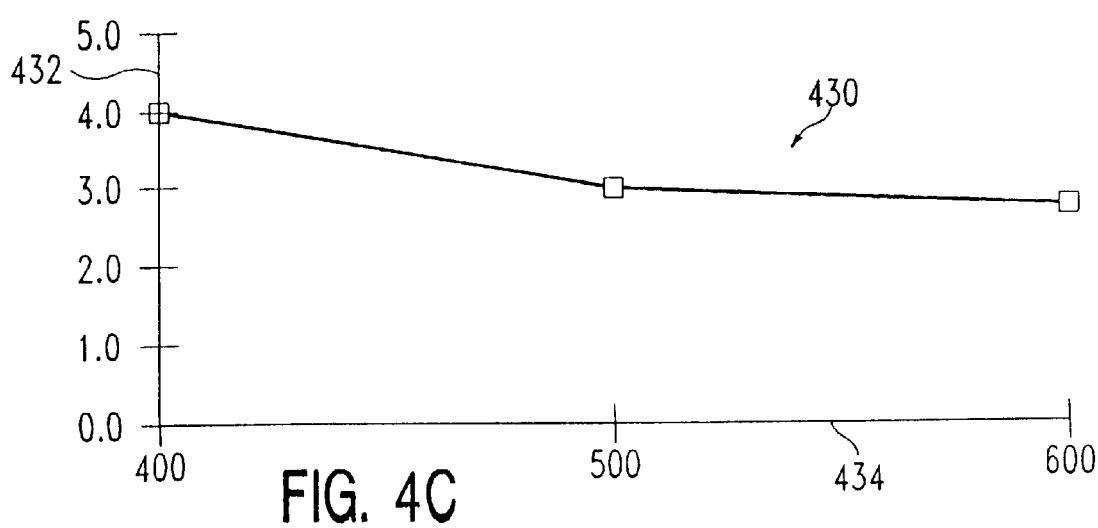
FIG. 4C illustrates selectivity of copper relative to patterning mask, shown as the ratio of copper etch rate to silicon oxide etch rate for the same test pattern as that described with reference to FIG. 4A, but as a function of bias power.

Curve 430 of FIG. 4C shows the selectivity ratio 432 as a function of bias power 434, with the selectivity ratio decreasing with an increase in bias power, at least up to 600 W.

Again, we investigated the effect of varying feed gas composition, where the sccm of HCl was decreased to 75 or 50 or 25 sccm with other feed gas flow rates held essentially constant at the values previously specified for an HCl flow rate of 100 sccm. We discovered that the selectivity ratio for copper to silicon oxide hard mask was relatively unaffected.

EXAMPLE THREE

Comparative Example

As previously described, we have determined that the etch process typically applied to aluminum does not work well for copper. This is not to say that such a process cannot be made to work if all of the variables are carefully optimized. However, the method of the present invention offers a wider process window.

In reviewing the March 1995 article "Dry Etching Technique for Subquarter-Micron Copper Interconnects" by Igarashi et al. where the etch process recommended is a variation of the process used for aluminum, we noticed that the interior of the etched copper features appeared to be hollow at some locations. To determine the cause of this phenomenon, we attempted to reproduce the results of Igarashi et al. This example is provided as a comparative example, since the process was carried out in the same equipment in which we achieved the elimination of the interior corrosion of the copper features.

The particular etched substrate illustrated in FIGS. 5A and 5B was prepared as follows: The substrate was a silicon wafer overlaid by a silicon oxide layer; a tantalum barrier layer about 500 Å thick overlying the silicon oxide surface; a layer of sputter-deposited copper about 5,000 Å thick overlying the tantalum barrier layer; a 250 Å thick tantalum layer overlying the copper layer; and, a 5,000 Å thick patterned silicon oxide hard mask overlying the tantalum layer.

The plasma feed gas comprised 100 sccm Ar, 20 sccm $Cl_2$, 15 sccm $N_2$, and 10 sccm $BCl_3$. A relatively high concentration of $N_2$ and a higher bias power during etching were used to for a thicker passivation layer on the sidewall.

The RF plasma source power was approximately 1,500 W. The bias power was approximately 500 W. The pressure in the etch chamber was about 10 mT. The temperature on the substrate surface was about 200° C., while the wall temperature of the etch chamber was about 80° C.

Figure 5A:
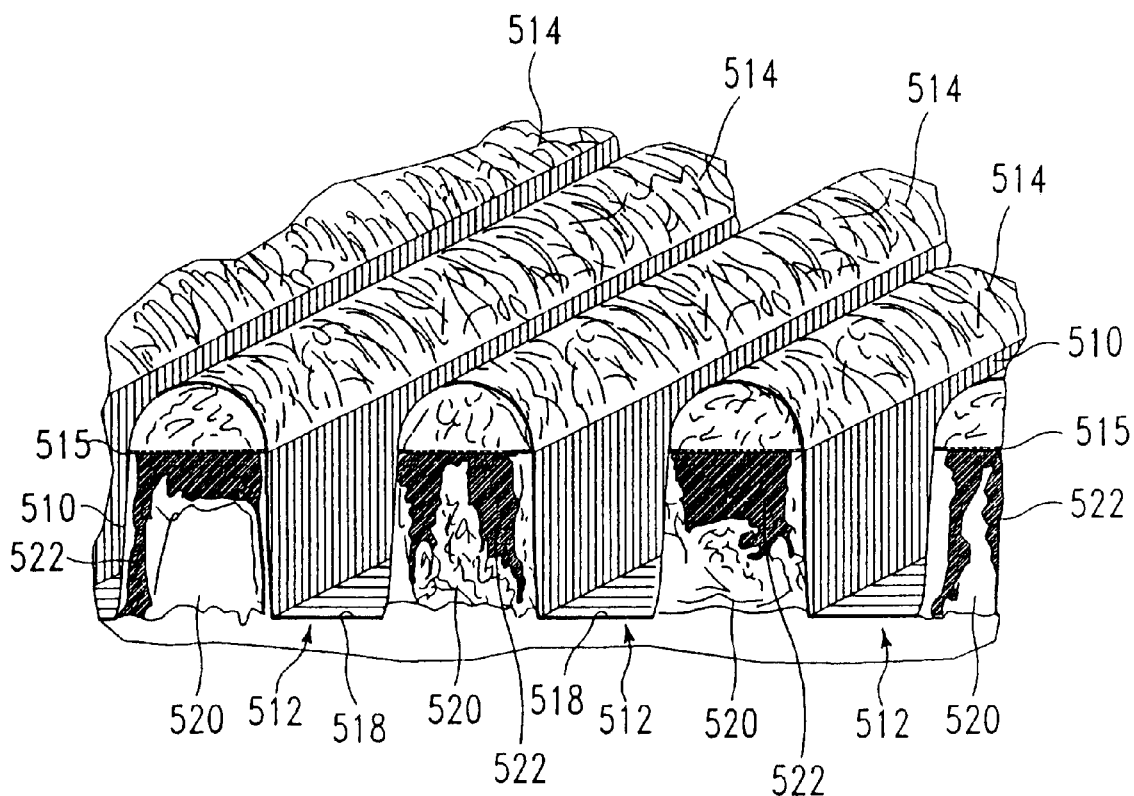
FIG. 5A is a three dimensional schematic of a copper film which was reactive ion etched using $Cl_2$, $BCl_3$, $N_2$, and Ar to produce a pattern of 0.5 μm wide lines and spaces. Although the integrity of the etched copper lines appears to be good on the surface, large portions of the interior of the copper lines is vacant space from reacted copper which has exited.
Figure 5B:
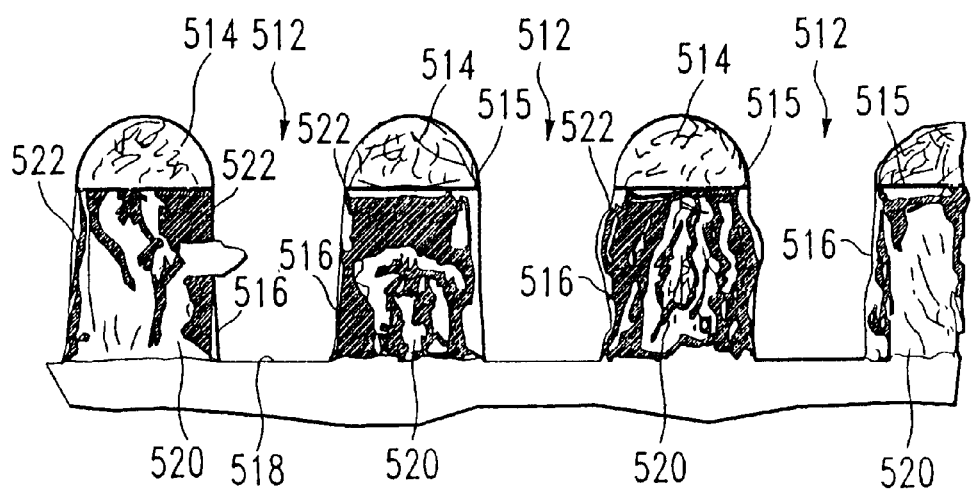
FIG. 5B is a schematic of the cross-sectional view of the FIG. 5A etched copper pattern, showing additional detail of the structure of the interior of the etched copper line.

FIGS. 5A and 5B are schematics of photomicrographs of the etched pattern of 0.5 μm lines 510 and spaces 512 created by the method described above. With reference to FIG. 5A, the silicon oxide hard mask 514 overlies tantalum barrier layer 515. The etched copper lines 510 include the copper 520 remaining after etch, surrounded by vacant space 522 where the copper has reacted with a corrosive agent to produce a volatile species which escaped into the process chamber. The exterior walls 516 of the etched copper have been passivated so that they remain relatively intact despite the corrosion of the interior of the copper line 510. The silicon oxide surface 518 of the etched spaces 512 is relatively free from contaminating deposits.

FIG. 5B shows the problem of the corrosion of the interior of the etched lines 510 in more detail. Again, the silicon oxide hard mask 114 sets above tantalum barrier layer 515. The copper line exterior walls 516 are apparently continuous and intact However, interior to the walls 516, the copper 520 has been corroded and the reactive species resulting from the corrosion have escaped leaving open space 522 surrounding the corroded copper 520.

EXAMPLE FOUR

A Preferred Embodiment of the Present Invention

As disclosed in the Summary of the Invention, the preferred embodiment of the invention provides for the use of hydrogen chloride (HCl) and/or hydrogen bromide (HBr) as the sole or principal source of the reactive species used in etching copper. Dissociation of the HCl and/or HBr provides the large amounts of hydrogen necessary to protect the copper feature etched surfaces from penetration by reactive species adjacent the etched surface. Additional hydrogen-comprising gas may be added to the plasma feed gas which comprises the HCl and/or HBr when the reactive species density in the etch process chamber is particularly high.

In this example, under the conditions specified, it is not necessary to add additional hydrogen-comprising gas to the plasma feed gas. Although this Example is for the use of HCl as the principal source of reactive species, HBr could be substituted in this example with equivalent results.

In this Example, the plasma feed gas consists of HCl at a flow rate of about 100 sccm, $N_2$ at a flow rate of about 20 sccm and $BCl_3$ at a flow rate of about 5 sccm, where the chemically reactive copper etchant was HCl, the $N_2$ was used to passivate silicon species (and some copper species), and the $BCl_3$ was used to scavenge oxygen generated by etch of the silicon hard mask or the silicon oxide dielectric layer underlying the copper line. In addition, we have evaluated varying ratios of the plasma feed gas components, such as: 50 sccm HCl and 5 sccm $N_2$; 50 sccm HCl, 25 sccm $N_2$, and 5 sccm $BCl_3$; 50 sccm HCl, 5 sccm $N_2$, and 5 sccm $CHF_3$; and, 100 sccm HCl, 5 sccm $N_2$, and 5 sccm $BCl_3$. We also evaluated HCl as the sole plasma feed gas at 50 sccm of HCl. In evaluating all of these plasma feed gases, we learned that we could produce a patterned etch of 0.5 μm wide lines and spaces where etch rate, selectivity, feature dimensions, and feature integrity are all excellent. In fact, the etch results were so similar, that FIGS. 6A, 6B, and 6C which represent this Example are representative of the features obtained for all of the plasma feed gas combinations evaluated, including HCl as the sole feed gas.

The substrate etched was a silicon wafer overlaid by a silicon oxide layer; a tantalum barrier layer about 500 Å thick overlying the silicon oxide surface; a layer of sputter-deposited copper about 5,000 Å thick overlying the tantalum barrier layer; 250 Å thick tantalum layer overlying the copper layer; and a 5,000 Å thick patterned silicon oxide hard mask overlying the tantalum layer.

The RF power to the plasma induction coil, the plasma source power, was about 1,500 W @ 2 MHz, and the RF power to the substrate support platen, the bias power, was about 500 W @ 13.56 MHz. The pressure in the process chamber was 20 mT. The substrate temperature was about 200° C. and the wall temperature of the process chamber was about 80° C. Etching was carrier out over a time period of about 100 seconds.

Figure 6C:
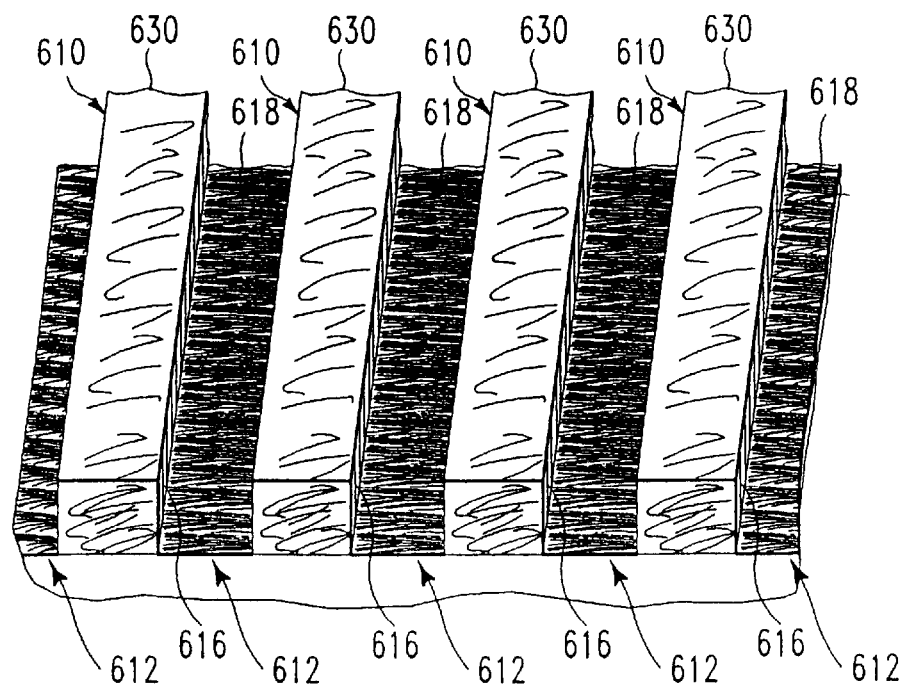
FIG. 6C is a schematic of the FIG. 5A etched copper pattern which shows the top surface of the etched lines (as well as the front edge) and the top surface of the etched spaces, to illustrate the absence of any deposits on the exterior of the etched lines and spaces.
Figure 6A:
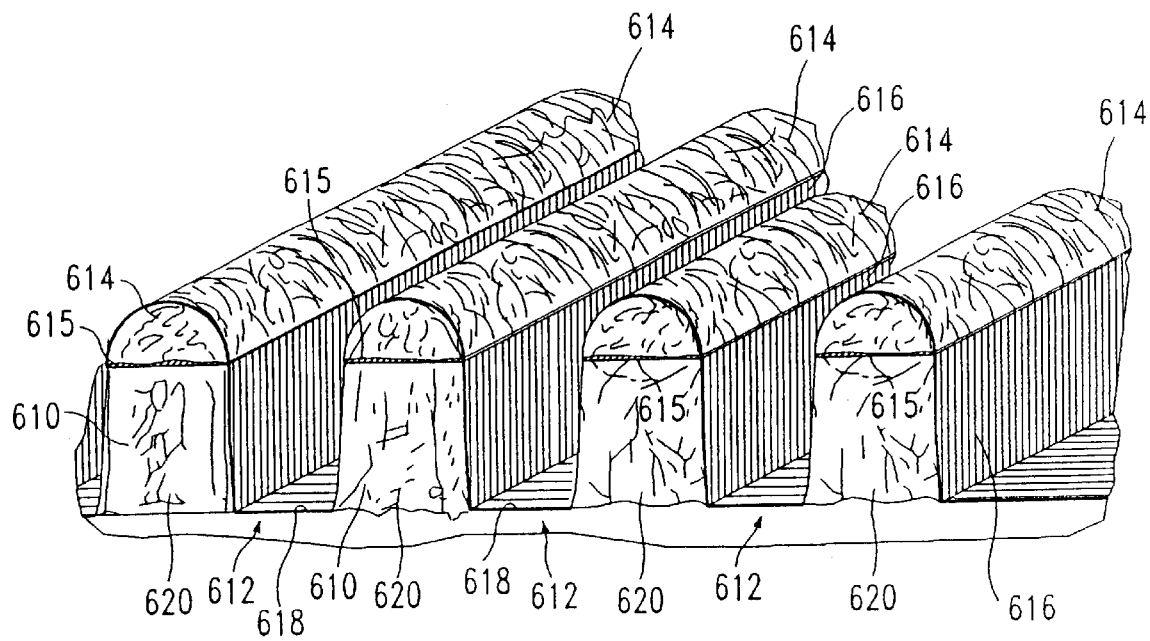
FIG. 6A is a three dimensional schematic of a copper film which was reactive ion etched using a preferred embodiment method of the present invention. The integrity of the interior of the etched copper lines is excellent.
Figure 6B:
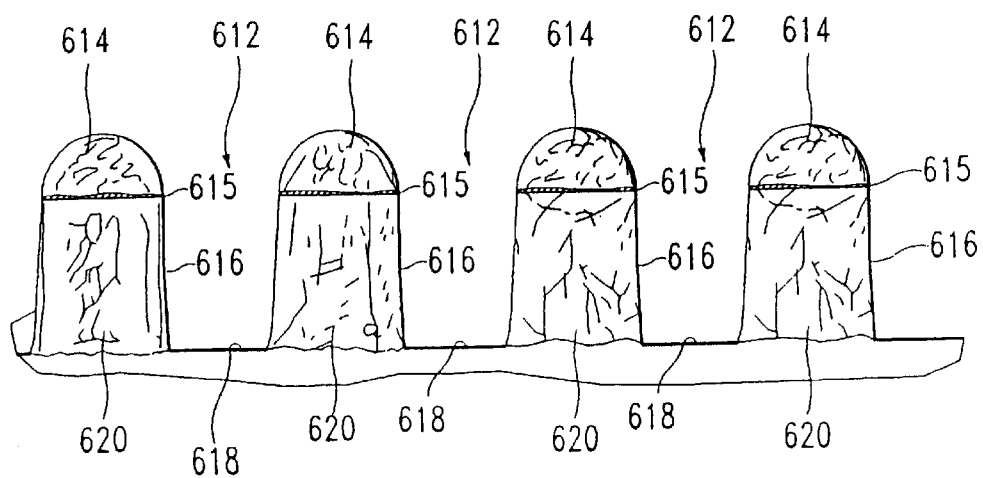
FIG. 6B is a schematic of the cross-sectional view of FIG. 5A etched copper pattern, showing additional detail of the structure of the interior of the etched copper line.

FIGS. 6A and 6B are schematics of photomicrographs of the etched pattern of 0.5 μm lines 610 and spaces 612 created using the method described this Example Four. With reference to FIG. 6A, the silicon oxide hard mask 614 overlies tantalum barrier layer 615. The etched copper lines 610 include the solid interior copper 620 remaining after etch. The exterior walls 616 of the etched copper are deposit free and exhibit the desired profile which is achieved by the anisotropic etch process described above. The silicon oxide surface 618 of the etched spaces 612 is also free from contaminating deposits.

FIG. 6B shows a schematic of the cross-sectional view of the lines and spaces of FIG. 6A. Again, the silicon oxide hard mask 614 sets above tantalum barrier layer 615. The copper line exterior walls 616 are free of deposits from the etch process. In addition, the interior copper 620 solidly fills the exterior walls 616, providing a line 610 structure having integrity.

By comparison with the line 510 structure from the Comparative Example Three, the absence of corrosion in the interior copper 620 of the preferred embodiment described in this Example Four is attributed to the generation of hydrogen upon dissociation of the HCl plasma feed gas. The hydrogen is believed to absorb on the surface of the copper, forming an H-rich layer. This H-rich layer reduces, and typically prevents reaction of the copper with Cl or $Cl_2$ by forming volatile HCl. Thus, the hydrogen present on the copper surface acts as a buffer which permits etching to occur without leaving behind excess chlorine on the copper surface which causes continuing undesired reaction with the copper after the desired etch is completed. It is this continuing undesired reaction, combined with the formation of copper oxides, which we are calling "corrosion". It is corrosion which generates vacant spaces (of the kind shown in FIGS. 5A and 5B) inside the walls of the copper lines.

FIG. 6C shows schematic of a photomicrograph of the FIG. 6A etched copper pattern. The photomicrograph shows the top surface 630 after removal of the silicon oxide hard mask, the walls 616 of the etched lines 610, and the silicon oxide surface 618 of etched spaces 612, to illustrate the absence of any deposits on these surfaces.

Once the non-corroded etched feature is created, a capping layer can be applied to the copper surface to prevent future corrosion. Preferred capping layers include silicon nitride and silicon oxynitride. These capping layers can be generated by adding nitrogen and/or a nitrogen-containing gaseous compound to an inert carrier gas, forming a plasma, and plasma sputtering against a silicon oxide-containing surface, such as a silicon oxide hard mask.

Although specific process conditions are described with respect to Example Four above, applicants have learned that the process window is quite broad and that the process variables can be adjusted over a wide range and still provide excellent etched copper features.

For example, the plasma source power supplied for production of reactive species (ions and neutrals) may vary widely. The minimum power required is the power necessary to break down HCl or HBr into several reactive species, such a H, excited H, $H^+$, Cl, excited Cl, $Cl^+$, excited HCl, $HCl^+$, Br, excited Br, and $Br^+$. Often the minimum power required is the power to ignite and sustain the plasma in the process chamber. In a DPS chamber of the kind we used, the minimum inductive RF power required is generally about 200 W @ 2 MHz. However, the power supplied may range from about 200 W to about 2,500 W, depending on the feature to be etched, the materials involved, and the make up of the plasma feed gas, for example. In addition to dissociation and ionization of the plasma feed gas, the RF power sustaining the plasma is also a source of supplying heat to the wafer surface (the higher the power, the higher the wafer temperature). The RF power also affects the production of UV light and/or IR light which is generated from the plasma These light sources may impact the reaction taking place on the substrate surface.

It is important to note that the plasma source power may be supplied from varying types of equipment, including: a parallel plate plasma source; an inductive coil, whether that coil is located externally to the process chamber, internally to the process chamber, or a combination of both; and a microwave plasma source (by way of example and not by way of limitation).

The bias power used to control ion bombardment on the substrate surface may also be varied over a range depending on the feature to be etched, the materials involved, and desired characteristics of the semiconductor device in general. The minimum bias power required for the HCl and HBr etch chemistry described herein is the power which can provide the desired ion directionality and ion bombardment energy for an anisotropic etch. In a DPS chamber of the kind we used, the minimum RF power required is generally about 50 W @ 13.56 MHz. However, the RF power supplied may range from about 50 W to about 800 W, depending on the feature to be etched, the materials involved, and the make up of the plasma feed gas, for example. Higher bias power typically increases the etch rate due to the higher ion bombardment energy; however, as shown with regard to Example 1, FIG. 3C, this is not necessarily the case. Higher bias power may result in the generation of additional species which affect etch rate. Bias power also affects the dimensionality, including the etch profile of the feature being etched, and must be adjusted as required to obtain proper feature dimensions. Higher bias power also results in an increase in the temperature of the substrate surface as a result of increased ion bombardment and may require a means for cooling of the substrate during the etch process.

Process chamber pressure variation, all other variables held constant, may affect the dissociation rate, ionization rate, and recombination rate of various plasma feed gases. It is possible to optimize the reactive species generated and to control the ratios of the etchant species using process chamber pressure. Thus, both passivation and etch rates can be adjusted using process chamber pressure. Pressure may also affect the thickness of the plasma sheath within the reactor and thereby the ion bombardment energy. The optimal process chamber pressure is equipment sensitive. In a DPS chamber of the kind we used, the optimal pressure appears to be about 20 mT. However, we have operated the process chamber at pressures ranging from about 5 mT to about 40 mT and achieved acceptable etch results.

The surface temperature of the substrate affects the reaction rates on that surface and the dissociation rate of etch by-products. When copper is etched using HCl or HBr, or a combination thereof as the principal source of the reactive etchant species, desorption of the etch-byproduct appears to be more critical than surface reaction rate, and it appears that a minimum substrate surface temperature of about 150° C. provides the necessary desorption rate.

Although the preferred embodiments described are with reference to an etching process where the composition of the plasma feed gas was constant throughout, one skilled in the art would appreciate that the feed gas could be varied during an etching process and the method of the present invention could be used for a limited time period during that etching process.

The above described preferred embodiments are not intended to limit the scope of the present invention, as one skilled in the art can, in view of the present disclosure, expand such embodiments to correspond with the subject matter of the invention claimed below.

We claim:

1. A method of patterning a metal film on a substrate surface for use in semiconductor applications, wherein said patterning is accomplished by plasma etching, said method comprising:

placing a substrate including said metal film on a substrate support pedestal within a plasma etch process chamber;

supplying a halogen-comprising plasma feed gas to said plasma etch chamber to generate an etchant plasma, wherein at least 40% of the total reactive species present in said etchant plasma are generated from a feed gas selected from the group consisting of HCl, HBr, and combinations thereof, and wherein 30% or less of other plasma-generated reactive species provide surface passivation of etched metal surfaces during etching of said metal film, whereby components of said plasma feed gas enable the application of sufficient hydrogen to an etched portion of a metal feature surface to protect said etched portion of said metal feature surface from reaction with reactive species during etching of an adjacent feature surface;

using said plasma feed gas to generate a plasma;

exposing said substrate to said plasma; and applying a heat transfer gas to a backside of said substrate during said patterning, to achieve and maintain said substrate surface at a temperature ranging from about 130° C. to about 300° C.

2. The method of claim 1, wherein said heat transfer gas is a chemically inert gas.

3. The method of claim 2, wherein said inert gas is helium.

4. The method of claim 1, wherein at least 50% of the total reactive species present in said etchant plasma are generated from a portion of said feed gas which comprises said HCl, HBr, and combinations thereof.

5. The method of claim 1, wherein said halogen-comprising feed gas also comprises hydrogen.

6. The method of claim 1 or claim 5, wherein said metal film comprises copper.

7. The method of claim 6, wherein said metal is copper and said pattern includes a feature having a critical dimension of 0.5 µm or less in size.

* * * * *